(12) United States Patent
Koc

(10) Patent No.: US 8,928,205 B2
(45) Date of Patent: Jan. 6, 2015

(54) ACTUATOR

(75) Inventor: Burhanettin Koc, Ettlingen (DE)

(73) Assignee: Physik Instrumente (PI) GmbH & Co. KG, Karlsruhe (DE)

( * ) Notice: Subject to any disclaimer, the term of this patent is extended or adjusted under 35 U.S.C. 154(b) by 55 days.

(21) Appl. No.: 13/502,457

(22) PCT Filed: Oct. 12, 2010

(86) PCT No.: PCT/DE2010/001195
§ 371 (c)(1),
(2), (4) Date: Jun. 1, 2012

(87) PCT Pub. No.: WO2011/044883
PCT Pub. Date: Apr. 21, 2011

(65) Prior Publication Data
US 2012/0319531 A1    Dec. 20, 2012

(30) Foreign Application Priority Data

Oct. 17, 2009  (DE) .................. 10 2009 049 719

(51) Int. Cl.
| | |
|---|---|
| H01L 41/08 | (2006.01) |
| H01L 41/09 | (2006.01) |
| H02N 2/00 | (2006.01) |
| H02N 2/02 | (2006.01) |
| H02N 2/10 | (2006.01) |
| H01L 41/047 | (2006.01) |
| H01L 41/083 | (2006.01) |

(52) U.S. Cl.
CPC ............ *H01L 41/0986* (2013.01); *H02N 2/002* (2013.01); *H02N 2/026* (2013.01); *H02N 2/028* (2013.01); *H02N 2/103* (2013.01); *H01L 41/0471* (2013.01); *H01L 41/0835* (2013.01); *H02N 2/025* (2013.01)

USPC ....................... 310/323.02; 310/369

(58) Field of Classification Search
USPC ..................... 310/323.02, 328, 366
See application file for complete search history.

(56) References Cited

U.S. PATENT DOCUMENTS

| | | | |
|---|---|---|---|
| 3,721,841 A | 3/1973 | Wilson | |
| 4,894,578 A * | 1/1990 | Honda | ..................... 310/323.02 |

(Continued)

FOREIGN PATENT DOCUMENTS

| | | |
|---|---|---|
| DE | 101 54 168 A1 | 5/2002 |
| DE | 10 2007 015 057 A1 | 10/2007 |

(Continued)

OTHER PUBLICATIONS

International Search Report (PCT/ISA/210) issued on Apr. 14, 2011, by German Patent Office as the International Searching Authority for International Application No. PCT/DE2010/001195.

(Continued)

*Primary Examiner* — J. San Martin
(74) *Attorney, Agent, or Firm* — Buchanan Ingersoll & Rooney PC

(57) ABSTRACT

An actuator, which can include piezoelectric material, is provided in the form of a single-layer or multi-layer flat plate. At least one layer has two electrodes spaced from each other by means of a separating area and arranged opposite each other both on the upper face of the at least one layer and on the lower face of the at least one layer. The electrodes of the upper face are arranged at an offset from the electrodes of the lower face. A motor is also provided to include the actuator and a movable element to be driven by means of the actuator.

15 Claims, 12 Drawing Sheets

(56) References Cited

U.S. PATENT DOCUMENTS

| | | | |
|---|---|---|---|
| 4,945,275 A * | 7/1990 | Honda | 310/323.02 |
| 5,008,581 A * | 4/1991 | Kumada et al. | 310/323.02 |
| 5,814,919 A | 9/1998 | Okumura | |
| 6,072,266 A * | 6/2000 | Tomikawa | 310/323.02 |
| 6,559,574 B2 * | 5/2003 | Maruyama | 310/323.02 |
| 6,707,232 B2 * | 3/2004 | Iino et al. | 310/323.02 |
| 7,061,159 B2 * | 6/2006 | Funakubo | 310/323.12 |
| 7,772,743 B2 * | 8/2010 | Doshida | 310/323.02 |
| 2002/0084724 A1 | 7/2002 | Morinaga et al. | |
| 2002/0140783 A1 | 10/2002 | Takahashi | |
| 2007/0236106 A1 | 10/2007 | Koc et al. | |
| 2009/0039735 A1 * | 2/2009 | Nitto et al. | 310/323.02 |

FOREIGN PATENT DOCUMENTS

| | | |
|---|---|---|
| EP | 2 216 837 A1 | 8/2010 |
| WO | 2004/077584 A1 | 9/2004 |

OTHER PUBLICATIONS

Office Action issued on Dec. 2, 2013, by the Chinese Patent Office in corresponding Chinese Patent Application No. 201080057828.0, and an English Translation of the Office Action. (14 pages).

Office Action (Notification of the Second Office Action) Issued on Aug. 4, 2014, by the State Intellectual Property Office of P.R.C., in corresponding Chinese Patent Application No. 201080057828.0, and an English Translation of the Office Action. (12 pages).

* cited by examiner

ACTUATOR

The invention relates to an actuator, preferably a piezoelectric actuator and a motor provided with the actuator according to the invention.

In many applications, such as mobile phones and so-called smart phones, there is a need to fabricate the respective devices increasingly smaller or flatter, respectively. Consequently, more and more smaller and flatter designed components for such devices are required, which for fabrication and assembly reasons should also be designed as simple as possible. EP 2 216 837 A1 in this context describes a simply designed piezoelectric motor occupying only very little space having a flat and plate-shaped actuator, which can be used for instance for driving the autofocus of a mobile phone camera. The actuator or motor shown there, however, permits motion only along one axis. It is necessary in some cases, that the respective motor allows motion in two axial directions or that the motor generates a rotational drive motion, respectively.

It is therefore the object of the invention to provide an actuator which is designed small or flat, respectively, and is able to realize motions in two axial directions while having a relatively simple design and which is additionally able to generate a rotational motion This objective is achieved by an actuator, preferably having piezoelectric material, in the form of a single-layer or multi-layer flat plate, wherein at least one layer has two electrodes spaced from each other by means of a separating area and arranged opposite each other both on its upper face and on its lower face, and the two electrodes of the upper face are arranged at an offset from the two electrodes of the lower face.

By means of the two electrodes arranged opposite each other on the upper face of the of the layer, oscillating deformations of the actuator in a first axial direction can be generated given appropriate electrical contacting and actuation, where said oscillating deformations can be used to drive an element to be driven in precisely this first axial direction. By means of the electrodes of the lower face being arranged at an offset from the electrodes of the upper face, oscillating deformations of the actuator in a different, second axial direction can now be generated by appropriate electrical contacting and actuation. These oscillating deformations can also be used to move an element to be driven, namely, along this second axial direction.

Electrical actuation of the electrodes of the upper face and the lower face is preferably effected in such a manner, that the actuator is excited to oscillate—in particular in the ultrasonic range—at a mechanical resonance frequency. In a particularly preferred manner, the actuator is operated under excitation of the second longitudinal resonance frequency or an integral multiple of the second longitudinal resonance frequency, wherein the longitudinal direction respectively denotes the direction along which the respective oppositely arranged electrodes of the upper and lower face are arranged or aligned, respectively.

By exciting the second longitudinal resonance frequency or integral multiples thereof, oscillating deformations of the actuator result, which are essentially in the plane of the actuator. In order to generate a drive motion of an element to be driven in a longitudinal direction by means of said periodic deformations or oscillations of the actuator, it is necessary that the deformations have a very specific temporal sequence commensurating with the electrical actuation signals. During a drive motion step, in which the actuator, being in frictional contact with the element to be driven, drive the element to be driven, a comparatively slow deformation in the longitudinal direction must occur, so that no relative sliding between the actuator and the element to be driven arises, i.e. static friction conditions between the actuator and the element to be driven should prevail. In contrast, during a return motion step in which the actuator performs a deformation in the opposite direction, there must be a relatively fast deformation in the longitudinal direction, so that the static friction conditions are abandoned and sliding friction occurs. In this manner, relative sliding of the actuator towards the element to be driven can be realized, and the actuator does not drive the element to be driven during the return motion step. A so-called stick-slip drive or a stick-slip motion results, respectively.

The electrical actuation of the electrodes of the upper and lower face can in temporal terms either be completely separate from each other or in interaction and temporally coordinated. For completely separate actuation, sole actuation of the electrodes of the upper face can for instance first occur, so that, for example, a motion of an element to be driven by the actuator is generated in a first axial direction, for example in the x-direction. Once the predetermined x-position of the element to be driven is reached, a motion of the element to be driven by the actuator can be generated in a second axial direction, for example, the y-direction, by means of sole actuation of the electrodes of the lower face.

By means of temporally coordinated electrical actuation—i.e. by realizing a phase shift or a phase difference regarding to the actuation signals—of the electrodes of the upper and lower face, it is possible to generate deformations that result in a rotational drive motion. A friction element, disposed, for instance, in the center of the actuator, which is provided for frictional contact with an element to be driven, can by temporally coordinated electrical activation of the electrodes of the upper and lower face perform a circular motion and thus bring the element to be driven into a rotational motion by driving it.

Preferred embodiments of the actuator according to the invention are the subject matter of the dependent claims.

It may be advantageous for the actuator to have the shape of a polygonal plate, preferably that of a square plate. It is also conceivable that the actuator has the shape of a round plate, preferably that of a circular plate, or the geometry of an annular plate.

Such embodiments of the actuator expand the design options and allow, for instance, specific adaptation to the geometric or structural conditions, respectively, for which the actuator is suitable or in which the actuator is used.

It may also be of advantage for the electrodes of the upper face to be arranged at an offset from the electrodes of the lower face by essentially 90°.

Such a configuration regarding the arrangement of the electrodes results in a particularly effective and efficient type of drive. It may also be of advantage for the electrodes of the upper face and/or the electrodes of the lower face to be arranged as mirror-images of each other.

Moreover, it may be advantageous for the separating area to be substantially linear. This allows realization of a relatively large surface electrode region and is in terms of production technology also comparatively easy to perform.

In addition, it may be advantageous for the actuator to comprise at least one friction element, the friction element being arranged along the linear separating area, preferably in its center or at one end thereof.

In the center of the linear separating area presently means in the center with respect to the longitudinal extension of the separating area. However, it may also be favorable, for example, to provide two friction elements spaced apart and—relative to the center in terms of the longitudinal extension of the separating area—arranged eccentrically along the linear separating area. By increasing the number of friction elements, higher drive force can be achieved.

It may also be of advantage to have the friction inserted into the actuator, preferably in a through-hole provided in the actuator.

Such designs regarding the arrangement of the friction element allow specific adaptation to the conditions in which the actuator is usable. In the event, that the actuator is designed as a polygonal plate and preferably as a square plate, placement of the friction element, for instance, in the shape of a sphere or a hemisphere, in the center of the linear separating area is advantageous, since the highest deformations usually occur there. In the center of the linear separating area presently means in the center with respect to the longitudinal extension of the separating area. However, it may also be favorable, for example, to provide two friction elements spaced apart and—relative to the center in terms of the longitudinal extension of the separating area—arranged eccentrically along the linear separating area. By increasing the number of friction elements, higher drive force can be achieved. In this, the friction element advantageously comprises a hard ceramic such as aluminum oxide ($Al_2O_3$), or silicon nitride ($Si_3N_4$), or material of a hard-metal alloy or a carbide such as tungsten carbide, and preferably is made of one of these materials.

In both cases, i.e. when using a friction element or when using two (or several) friction elements, they can, for instance, be spherical and be inserted into a respective through-hole of the actuator reaching from the upper face to the lower face and be fixed or attached, respectively, in the through-hole means of an adhesive, e.g. epoxy resin. This type of attachment of the friction element or friction elements, respectively, offers significant advantages in manufacturing. In particular for automated fabrication, the sphere-shaped friction element can be easily inserted into the through-hole, where, in terms of dimensions, the friction element is designed such that its radius is slightly smaller than the radius of the through-hole. In this manner, the friction element quasi "falls" into the through hole but is prevented from falling through due to a structural element normally arranged directly behind the actuator, such as, for example, the structural element of a motor into which the actuator is installed. Since both the height of the actuator is known as well as the diameter of the spherical friction element, the part of the friction element protruding from the actuator is accurately determined.

Another way of fixing a friction element is to attach a sphere section, preferably a hemisphere, on the surface of the actuator and to preferably adhesively bond it thereto.

In the event that the actuator has the shape of an annular plate, it is advantageous to have the friction element or the friction elements, respectively, be disposed at the end of the linear separating area. This placement of the friction elements is relatively easily performed in terms of the manufacturing technology.

It may prove advantageous for the actuator to comprise piezoceramic material. Lead zirconium titanate (PZT) is here particularly suited. Piezoceramic material generally has a high (inverse) piezo-electric effect, i.e for a given electrical voltage, these materials show high expansion or deformation.

Likewise, it may prove advantageous when the actuator has a multilayer structure and an odd number of layers, where the respective electrodes facing each other on adjacent layers have the same orientation. By means of a multilayer structure, the actuator can be actuated with a correspondingly lower electric voltage.

Furthermore, it may prove advantageous if the upper layer and/or the lower layer of the actuator are/is designed as an inactive layer. This results in a particularly reliable design of the actuator, where integration of the actuator in a respective motor is additionally facilitated due to insulation reasons.

Furthermore, it may prove advantageous if the upper layer and/or the lower layer of the actuator are/is provided with termination electrodes. This enables electrical contacting of the actuator to be easily performed.

It may be advantageous to have the actuator be operated while exciting the second resonant frequency or an integral multiple of the second longitudinal resonance frequency. This results in oscillations or deformations, respectively, of the actuator, which can be used in a particularly effective manner to drive an element to be driven.

Furthermore, it may, by electrically actuating the electrodes of the upper face, be advantageous to have oscillating deformations of the actuator along a first axial direction be achievable, which can be used for driving a movable element being in contact with the actuator in the first axial direction. Likewise, it may, by electrically actuating the electrodes of the lower face, be advantageous to have oscillating deformations of the actuator along a second axial direction be achievable, which can be used for driving a movable element being in contact with the actuator in the second axial direction. In this manner, independent motions of the actuator in two different axial directions preferably disposed perpendicular to each other are possible or the actuator can be used to drive a movable element to be driven, being in frictional contact with it, in two different axial directions.

Furthermore, it may be advantageous, by out-of-phase (dephased) electrical actuation of the electrodes of the upper face and the electrodes of the lower face, to have Hula-Hoop-like deformation of the actuator be achievable, which can be used for rotationally driving a movable element being in contact with the actuator. For example, the electrodes on the upper face can be actuated with a sinusoidal voltage signal, while simultaneously the electrodes of the lower face are charged with a co-sinusoidal voltage signal. Superimpositioning of deformations in two different axial directions thus results, where the deformations spread or propagate, respectively, in a circular or hula-hoop manner, respectively. A friction element, disposed for instance at the center of the actuator, therefore performs a quasi circular motion which can be transferred by frictional contact to an element to be driven.

Moreover, it may be advantageous to have the actuator represent a stick-slip drive. A stick-slip drive (or inertia drive) comprises a relatively slow stick phase, in which static friction between the actuator and the element to be driven prevails and which causes the actual drive, and a slip phase with dynamic friction between the actuator and the element to be driven, which is realized by a fast retraction moment. The stick-slip drive or the slow forward motion and the rapid reverse motion, respectively, are here achieved by appropriate electric actuation of the electrodes attached to the actuator. This can be applied both for linear motions as well as for rotational motions. A stick-slip drive is designed comparatively simple and is therefore both easily realized and installed.

In addition, it may be advantageous to have the deformations, realized by electrical actuation of the electrodes, be located in the plane of the actuator. This has a particularly advantageous effect on the tribological properties of the tribocontact between the actuator and the element to be driven, and in this, especially regarding low wear. In addition, a motion component in the third dimension—thus beyond the plane of the actuator—thus results in a more stable performance compared to actuators, for which the friction element is set, for example, into an elliptical motion.

Another preferred aspect of the invention relates to a motor comprising the actuator according to one of the previous advantageous designs and a movable element to be driven by the actuator.

Preferred developments of the inventions result from combinations of the dependent claims or parts thereof.

BRIEF DESCRIPTION OF THE DRAWINGS

In a schematic manner not drawn to scale.

DETAILED DESCRIPTION OF THE PREFERRED EMBODIMENTS

Figure 1:
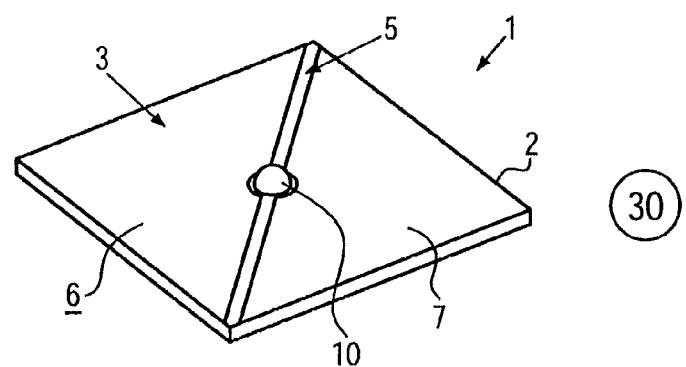
FIG. 1 shows an actuator according to the invention in the shape of a square plate
Figure 1:
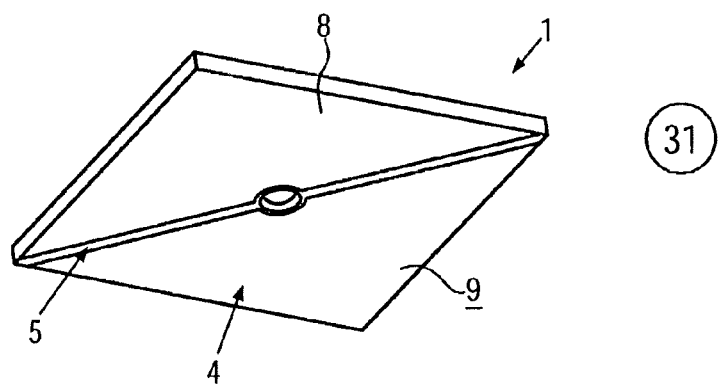

FIG. 1 schematically shows an actuator 1 according to the invention in the shape of a square single-layer plate. The upper illustration 30 shows a perspective view of the actuator from above, i.e. looking onto its upper face 3, whereas the lower illustration 31 shows the actuator from below, i.e. looking onto its lower face 4. There are two substantially triangular-shaped electrodes 6 and 7 arranged on the upper face 3, where an essentially linear and non-electroded, i.e. having no electrodes, separating area 5 is located between the two electrodes 6, 7, which extends from one corner of the actuator to the diagonally opposite corner. Said essentially linear separating area quasi forms a line of symmetry with respect to which the electrodes 6 and 7 are arranged in a mirrored manner.

The electrodes 6, 7 extend up to the respective side surfaces of the actuator and are aligned with it. It is just as well conceivable, however, that the electrodes at least partially do not extent all the way to the side surfaces, so that a corresponding region of the upper face 3, in addition to the separating area 5, is non-electroded. Regarding the longitudinal extension of the essentially linear separating area 5, a friction element 10 is arranged in its center or in the central region. The actuator 1 for this purpose comprises a corresponding through-hole into which the sphere-shaped friction element 10 is inserted or embedded, respectively. The friction element 10 is by means of an adhesive, e.g. epoxy resin, attached in the through-hole. A defined part of the spherical friction element 10 protrudes beyond the surface of the actuator from its upper face 3. The spherical friction element 10 can just as well protrude beyond the surface of the actuator from its lower face 4. It is moreover conceivable, that a friction element 10 is given in the shape of a spherical segment, which with its flat side is attached to the surface of the actuator 1 on its upper face 3 or its lower face 4, preferably by means of an adhesive.

On the lower face 4 of the actuator 1 there are likewise two electrodes 8, 9 arranged, which in their shape essentially correspond to the electrodes 6, 7 of the upper face 3, but which are arranged at an offset of approximately 90° thereto. Here as well, the electrodes 8, 9 are separated from each other by an essentially linear, non-electroded separating area 5. The separating area 5 of the lower face 4 is here arranged substantially perpendicular to the separating area 5 of the upper face 3 The electrodes 8, 9 extend up to the respective side surfaces of the actuator and align with it. It is just as well conceivable, however, that the electrodes at least partially do not extent all the way to the side surfaces, so that a corresponding region of the upper face 4, in addition to the separating area 5, is non-electroded.

The piezo-ceramic material is located between the upper face 3 and lower face 4 or between the electrodes 6, 7 and the electrodes 8, 9, respectively.

Figure 2:
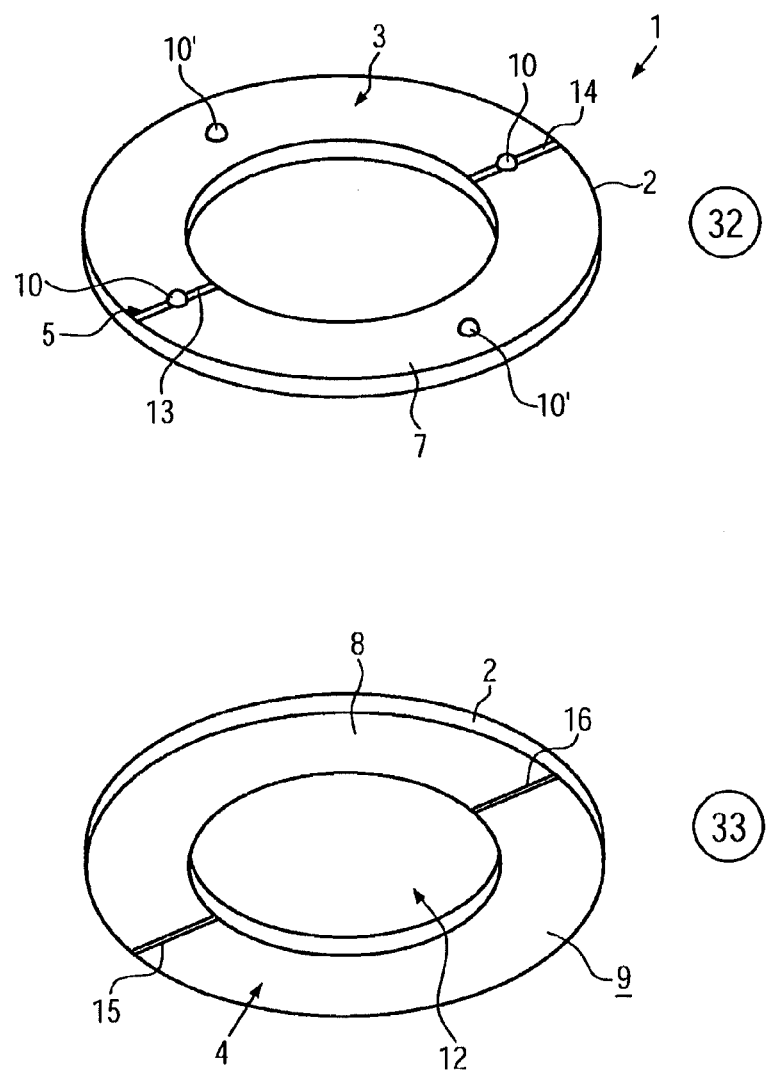
FIG. 2 shows an actuator according to the invention in the shape of an annular plate

FIG. 2 schematically shows an actuator 1 according to the invention in the shape of an annular single-layer plate. The upper illustration 32 shows a perspective view of the actuator from above, i.e. looking onto its upper face 3, whereas the lower illustration 33 shows the actuator from below, i.e. looking onto its lower face 4. There are two essentially semicircular electrodes 6 and 7 arranged on the upper face 3, where an essentially linear and non-electroded separating area 5 is located between the two electrodes 6, 7. Said linear separating area 5 is quasi interrupted by the recess 12 in the inner region of the annular actuator, so that two separating area portions 13 and 14 result. These separating area portions 13 and 14 are arranged along a line extending through the center of the annular actuator. This line is also the line of symmetry with respect to which the electrodes 6 and 7 are mirrored.

The electrodes 6, 7 extend in the radial direction to the side faces of the actuator and align with it. It is also conceivable to design the electrodes such they are at least partially spaced from the side faces of the actuator. With respect to the longitudinal extension of the separating area portions 13, 14, a friction element 10 is arranged in each of their centers, which is sphere-shaped and embedded into the actuator, so that only the spherical section protrudes from the actuator from its upper face 3. In addition to said two oppositely disposed friction elements 10, two more friction elements 10' exist, which are likewise arranged opposite each other, but which are arranged at an offset of essentially 90° relative to the two friction elements 10 previously mentioned. The friction elements 10' are arranged within the area of the electrodes 6 and 7.

It is also conceivable that the friction elements 10 with respect to the longitudinal extension of the separating area portions 13, 14 are arranged at their end, preferably at the radially inner end of the separating area portions.

On the lower face 4 of the annular actuator 1, there are likewise two electrodes 8, 9 arranged, which in their shape correspond to the electrodes 6, 7 of the upper face 3, but which are arranged at an offset of 90° thereto. Here as well, the electrodes 8, 9 are separated from each other by an essentially linear, non-electroded separating area 5 comprising the two separating area portions 15, 16. These separating area portions 15 and 16 are arranged along a line extending through the center of the annular actuator, which simultaneously is the line of symmetry with respect to which the electrodes 6 and 7 are arranged in a mirrored manner. Said line of symmetry, along which the separating area portions 15 and 16 are arranged, intersects the line of symmetry, along which the separating area portions 13 and 14, are arranged, at an angle of essentially 90°.

It is also conceivable that the friction elements 10' with respect to the longitudinal extension of the separating area portions 15, 16 are arranged at their end, preferably at the radially inner end of the separating area portions.

Figure 3:
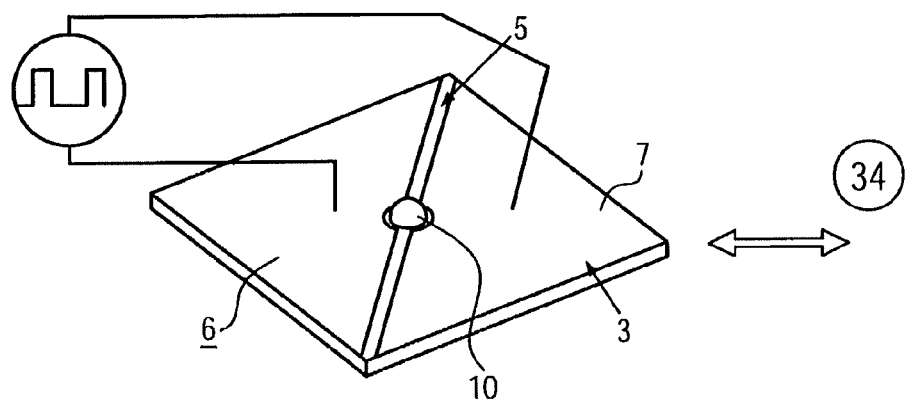
FIG. 3 shows electrical actuation of the actuator according to FIG. 1 for realizing a two-axis linear motion.
Figure 3:
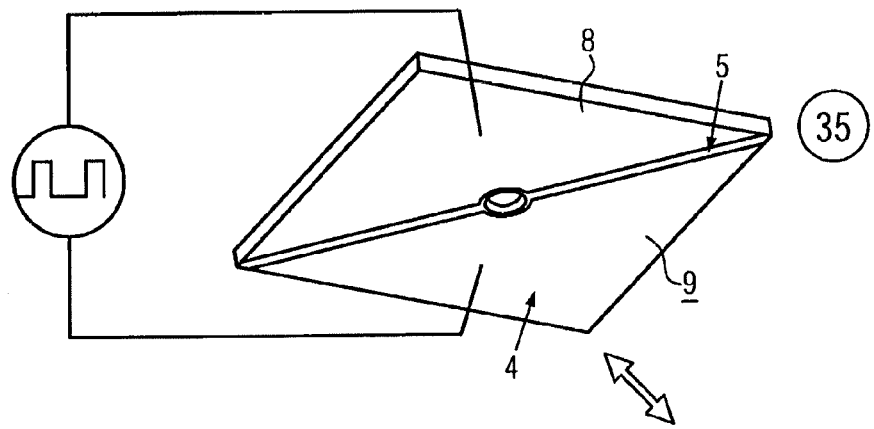

FIG. 3 schematically shows electrical actuation of the square actuator according to FIG. 1 for realizing a two-axis linear motion. The electrodes 6, 7 of the upper face 3 and the electrodes 8, 9 of the lower face 4 are actuated independently of each other with an electrical actuation voltage. According to the above illustration 34 of FIG. 3, actuation of the electrodes 6, 7 is effected with a square wave, where the electrodes 6, 7 are actuated with inverse polarity. The square wave presently preferably has a duty cycle of 60 to 80. In the previously described electrical actuation of the electrodes 6 and 7, periodical deformations or oscillations result, respectively, or oscillations being essentially perpendicular to the linear separating area 5 of the upper face 3, which can be transferred via the friction element 10 to an element to be driven, whereby the element to be driven can be set into a respective motion. In analogy to the above, actuation of the electrodes 8, 9 according to the illustration 35 below of FIG. 3 is effected by means of a square wave, where the electrodes 8, 9 are likewise actuated with inverse polarity. The square wave here preferably has a duty cycle of 60 to 80. Said electrical actuation of the electrodes 8 and 9 leads to periodical deformations or oscillations, respectively, or oscillations essentially perpendicular to the linear separating area 5 of the lower face 4, where the oscillations can be transferred via the friction element 10 to an element to be driven, whereby the element to be driven can be set into a respective motion. By means of electrically actuating the electrodes 6, 7 of the upper face 3 and the electrodes 8, 9 of the lower face 4 in a manner temporally separated from each other, deformations or oscillations, respectively, in two different axial directions of the actuator are possible and hence also a corresponding two-axis motion of an element to be driven by the actuator. From a temporal view, actuation of the electrodes 6, 7 is effected first and thereafter actuation of the electrodes 8, 9, or vice versa. From a temporal view, this first leads to oscillations along an axial direction, and as soon as the corresponding motion of an element to be moved by the actuator is completed, oscillations along the second axial direction follow, which drive the element to be driven along the second axial direction.

Figure 4:
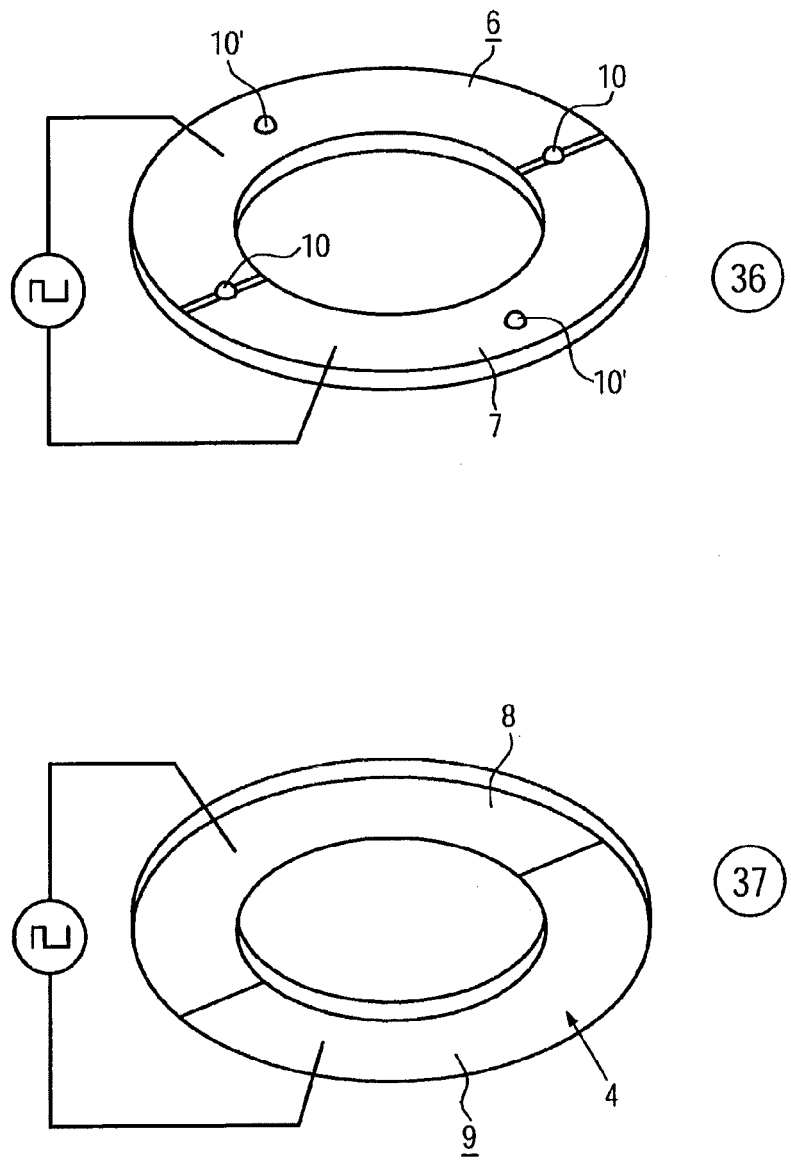
FIG. 4 shows electrical actuation of the actuator according to FIG. 2 for realizing a two-axis linear motion.

FIG. 4 schematically shows electrical actuation of the annular actuator according to FIG. 2 for realizing a two-axis linear motion. In this, the upper illustration 36 shows contacting of the electrodes 6, 7 of the upper face 3, whereas the lower illustration 37 shows contacting of the electrodes 8 and 9 of the lower face 4. Since electrical contacting is effected in an identical manner like in the description to FIG. 3, this shall presently therefore not be discussed in more detail.

Figure 5:
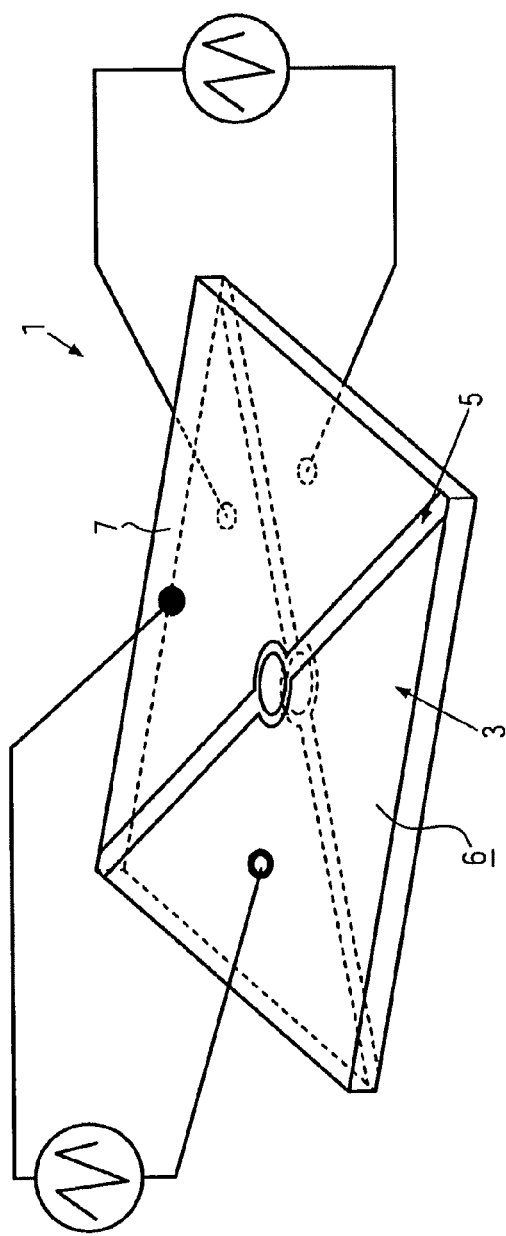
FIG. 5 shows electrical actuation of the actuator according to FIG. 1 for realizing a rotational motion.

FIG. 5 schematically shows electrical actuation of the square actuator according to FIG. 1 for realizing a rotational motion. In this, contacting is per se identical to that shown in FIG. 3, where for the (temporal) electrical actuation, there is the difference that the electrodes 6, 7 of the upper face 3 are actuated with a sinusoidal voltage signal, whereas the electrodes 8, 9 of the lower face 4 are simultaneously actuated with a co-sinusoidal voltage signal. The voltage signals for actuating the electrodes 6, 7 and 8, 9 are identical, however, they have a phase difference of 90°. There is thus a defined temporal adjustment regarding the electrical actuation of the electrodes 6, 7 and 8, 9, overall resulting in a deformation of the actuator resembling a hula-hoop motion. The center area of the actuator—in which normally the friction element is disposed, which is not shown in FIG. 5—presently performs an essentially circular motion. A friction element disposed in the center area of the actuator is therefore able to set an element to be driven in rotational motion.

Figure 6:
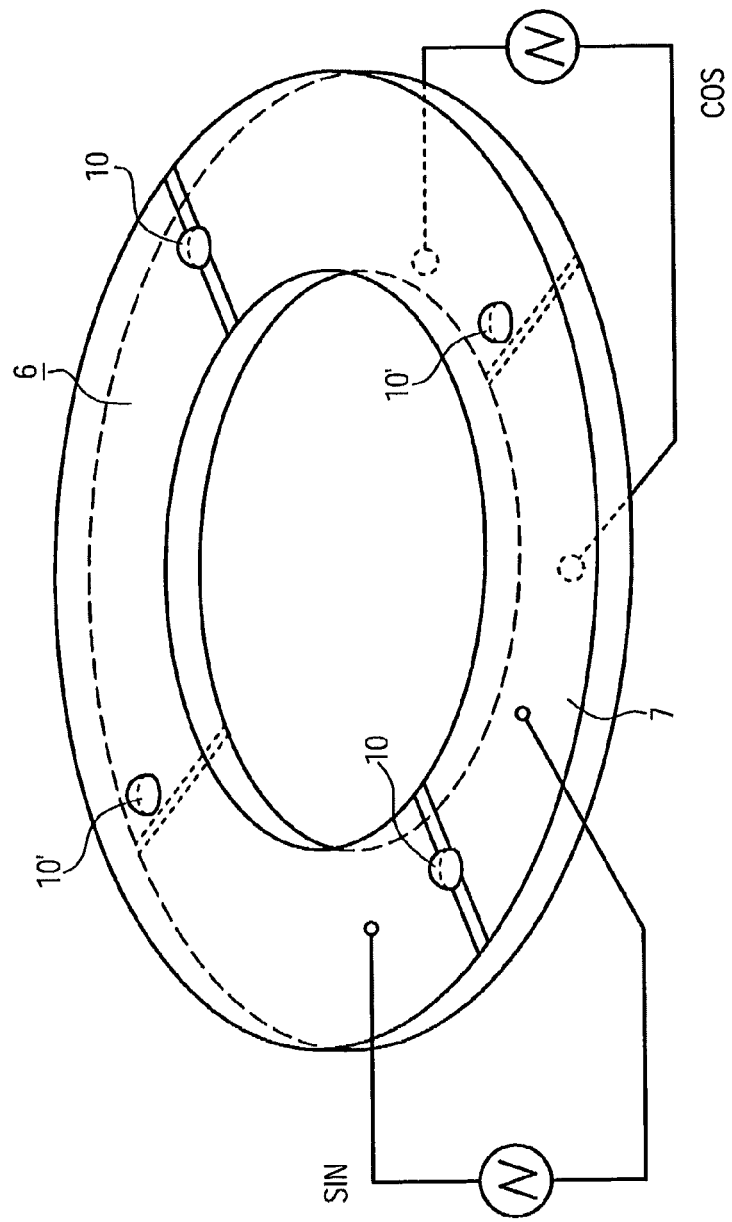
FIG. 6 shows electrical actuation of the actuator according to FIG. 2 for realizing a rotational motion.

FIG. 6 schematically shows electrical actuation of the annular actuator according to FIG. 2 for realizing a rotational motion. Since actuation is basically performed in the same manner as with the actuator of FIG. 5 any further description is here dispensed with.

Figure 7:
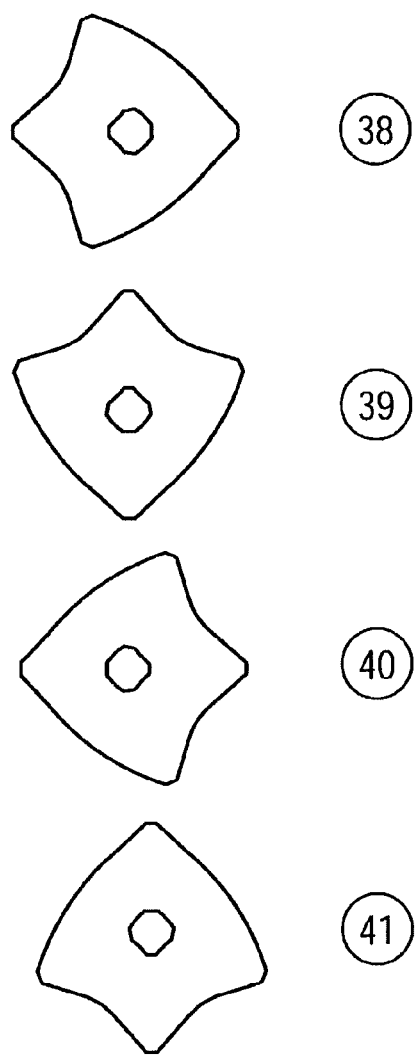
FIG. 7 shows deformations of the actuator according to FIG. 1 during electrical actuation according to FIG. 5 by means of the finite element method.

FIG. 7 in illustrations 38 to 41 shows deformations of the square actuator according to FIG. 1 during electrical actuation according to FIG. 5 which was calculated by means of the finite element method (FEM). From top to bottom or based on the illustrations 38 to 41, four different states of deformation are illustrated at different, successive times. In this, the center point of the actuator moves essentially in a circular path, whereas the deformations of the actuator in the area around the center represent a hula-hoop motion. Furthermore, FIG. 7 shows that the corners of the plate-shaped actuator perform relatively large deformation or oscillations, respectively. Therefore, it is presently advantageous to support the actuator in an installed state on its side faces, preferably at their center since there are considerably smaller deformations there. In this manner, support for the actuator is possible, which allows particularly efficient operation of the actuator.

Figure 8:
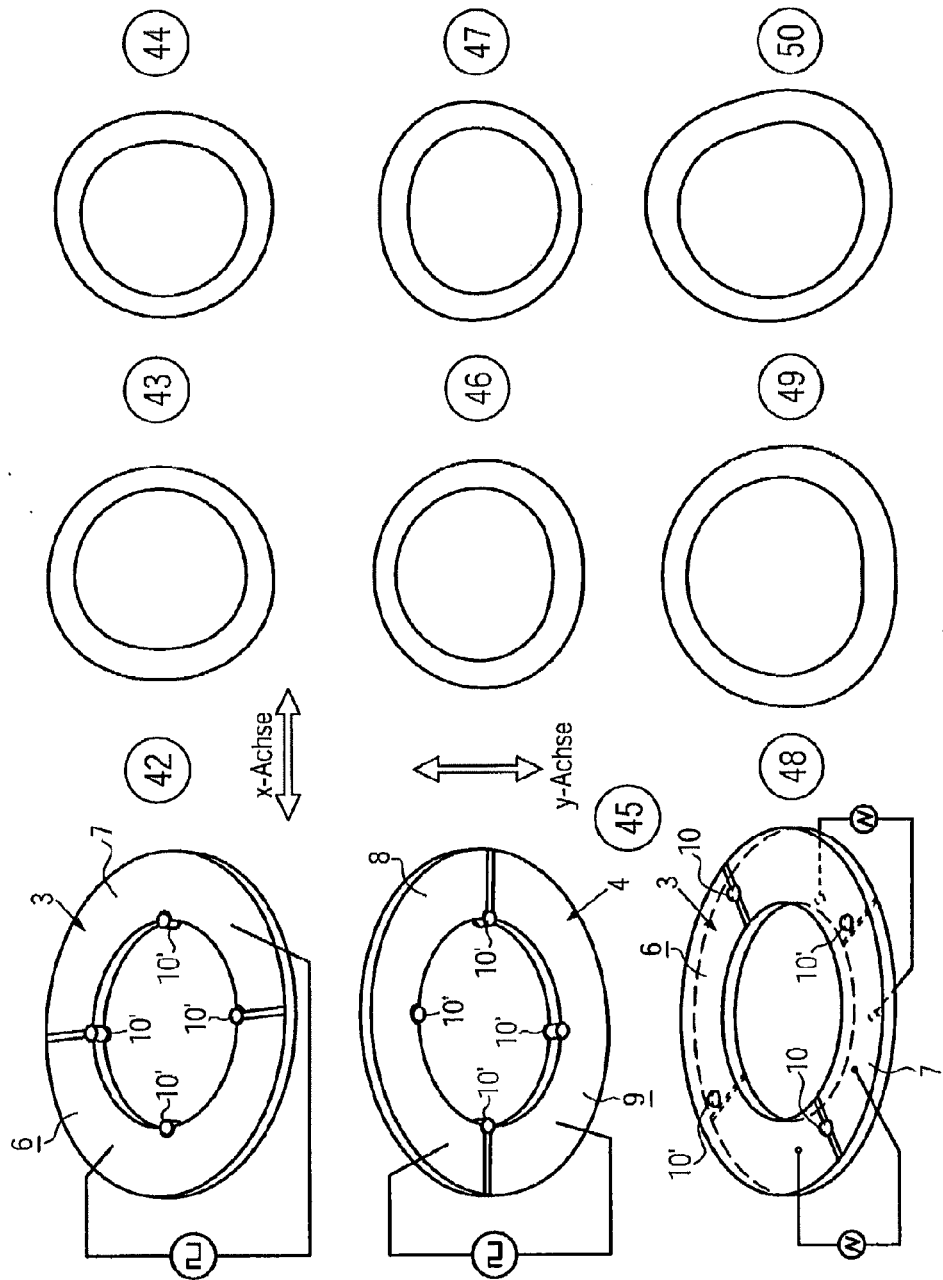
FIG. 8 shows deformations of the actuator according to FIG. 2 during electrical actuation according to FIGS. 4 and 6 by means of the finite element method.

FIG. 8 in illustrations 42 to 50 shows deformations of the annular actuator according to FIG. 2 during electrical actuation according to FIG. 4 and FIG. 6, which were calculated using the FEM. Illustration 42 presently repeats the electrical contacting, already shown in illustration 36 of FIG. 4, for realizing a deformation or oscillating motion, respectively, in one axial direction. It is visible from illustrations 43 and 44 showing the deformation of the actuator at two different points in time being calculated using the FEM, that the actuator essentially performs deformations in the direction of the drawn-in x-axis and is thus able to set an element to be driven, being in friction contact with it, in a corresponding motion.

Illustration 45 of FIG. 8 presently is the electrical contacting for realizing a deformation or oscillating motion, respectively, in a second axial direction, which is already shown in illustration 37 of FIG. 4. It is visible from illustrations 46 and 47 showing the deformation of the actuator at two different points in time which is calculated using the FEM, that the actuator essentially performs deformations in the direction of the drawn-in y-axis and is thus able to set an element to be driven, being in friction contact with it, in a corresponding motion.

Illustration 48 of FIG. 8 finally repeats the electrical actuation, already shown in FIG. 6, of an annular actuator for realizing a rotational motion. Illustrations 49 and 50 illustrate the deformations of the actuator at two different points in time using FEM calculations.

Figure 9:
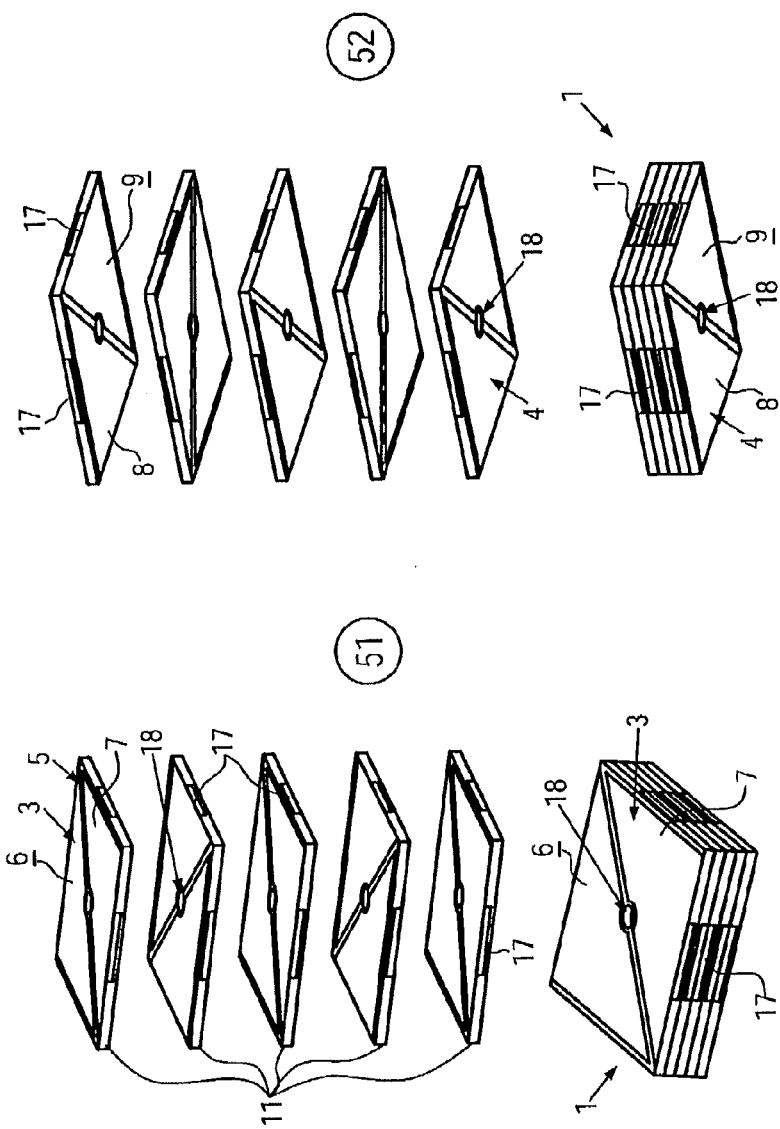
FIG. 9 shows an actuator according to the invention in the shape of a square plate which is structured in several layers.

FIG. 9 in illustrations 51 and 52 shows an actuator according to the invention in the shape of a square plate, where the actuator is structured in several layers 11. Illustration 51 shows the individual layers 11 and the corresponding actuator 1 composed thereof in a perspective view looking towards the upper face/s of the actuator 1 or the layers 11, respectively, whereas illustration 52 shows the individual layers and the corresponding actuator 1 composed thereof in a perspective view looking towards the lower face/s of the actuator 1 or the layers 11, respectively. The actuator 1 is presently composed up of five individual layers 11, each layer comprising a structure that corresponds to the structure of the actuator as a whole. Therefore, each layer on its upper face 3 and its lower face 4 comprises two triangular-shaped electrodes 6, 7, 8 and 9 arranged in mirror-image, where the electrodes 8, 9 of the lower face 4 are essentially arranged at an offset of 90° from the electrodes 6, 7 of the upper face 3. Adjacent layers 11 are each arranged at an offset of 90° from one another. The contacting of the electrodes 6, 7, 8, 9 on the upper and lower faces is performed by means of side electrodes 17 which are arranged on the side faces of the individual layers 11.

Each layer 11 in its center of area has a through-hole 18, so that the composed actuator also has a through hole 18 in its center into which the friction element, not shown here, preferably in the shape of a sphere, can be inserted and preferably adhesively bonded.

Figure 10:
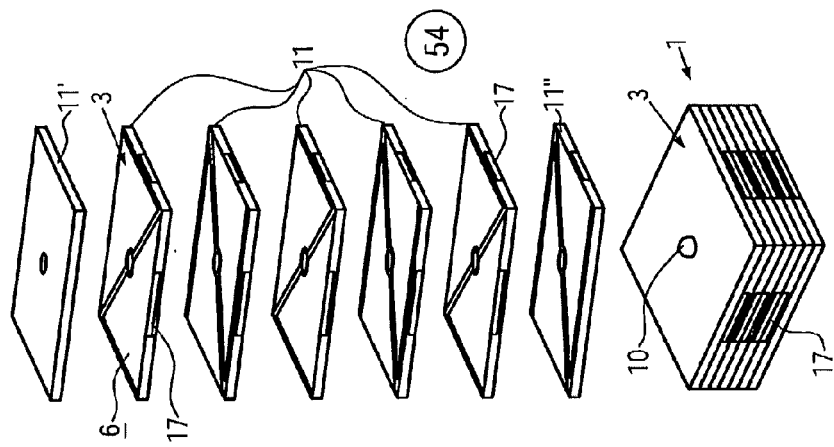
FIG. 10 shows another actuator according to the invention in the shape of a square plate which is structured in several layers.
Figure 10:
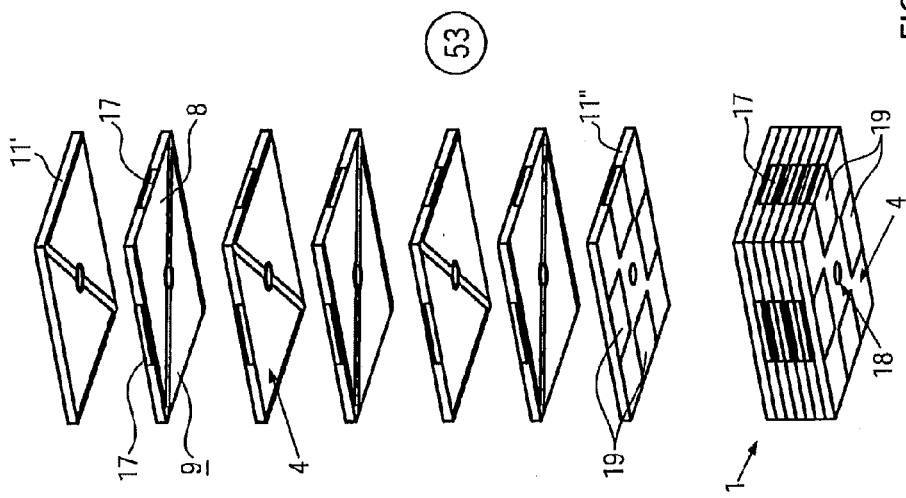

FIG. 10 in illustrations 53 and 54 shows further embodiments of an actuator according to the invention in the shape of a square plate, which is structured in several layers. While illustration 53 shows the individual layers 11, 11', 11" and the corresponding actuator 1 composed thereof in a perspective manner looking towards the lower face/s 4 of the actuator 11 or the layers, respectively, illustration 54 shows the individual layers 11, 11', 11" and the corresponding actuator 1 composed thereof in a perspective manner looking towards the upper face/s 3 of the actuator or the layers, respectively. The actuator 1 is composed of a total of seven layers, the respective outermost layers representing inactive layers 11', 11". Inactive in the present context means that these layers, due to a respective (lack of) electroding, are not intended to perform any deformations. They actively—i.e., due to electrical excitation—perform no deformation. The upper inactive layer 11' in illustration 53 has no electrodes, whereas the lower inactive layer 11" in illustration 53 on its lower face 4 has four termination electrodes 19 arranged at an offset of 90° to each another, via which the electrodes 17 provided on the side faces of the layers 11 disposed between the inactive layers 11', 11" can be supplied with a corresponding electrical actuation voltage. Electrical contacting from only one face of the actuator 1 is thus possible and presently in particular from the lower face 4, which is advantageous in particular for automated fabrication. It is of course also possible to provide only the upper inactive layer 11' with termination electrodes 19. Also, both the upper inactive layer 11' as well as the lower inactive layer 11" can be provided with termination electrodes.

The layers 11 being disposed between the inactive layers 11', 11" each on their upper face 3 and their lower face 4 comprise two triangular-shaped electrodes 6, 7, 8, 9 arranged in mirror-image, where the electrodes 6, 7 of the upper face 3 are arranged at an offset of 90° from the electrodes 8, 9 of the lower face 4. All layers 11, 11', 11" at their center have a through-hole 18 or a through-bore 18, respectively, so that the composed actuator 1 in a corresponding manner has a through-hole 18, into which for instance a spherical friction element can be inserted. Illustration 54 of FIG. 10 shows, not to scale, a sphere-shaped friction element inserted into the through-hole 18, which extends to the lower face 4 of the actuator 1 and aligns with it.

Figure 11:
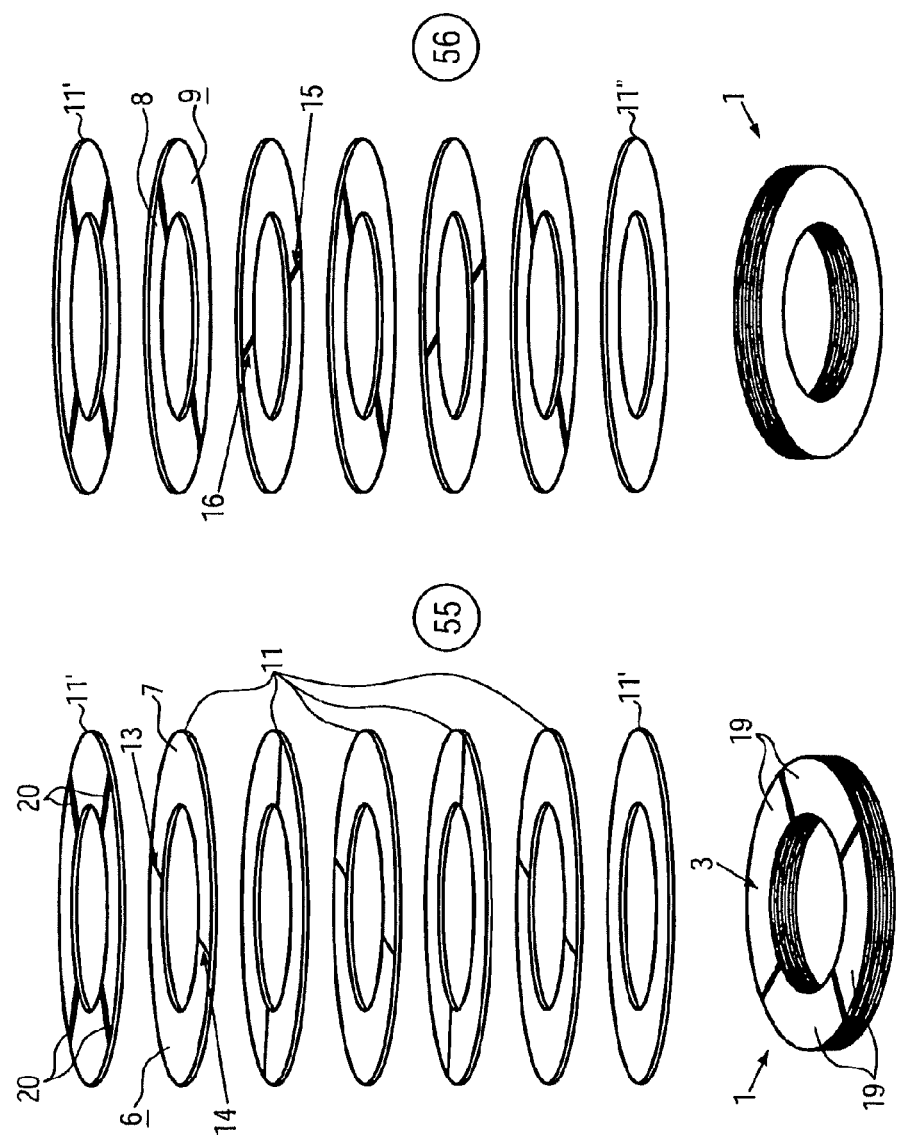
FIG. 11 shows an actuator according to the invention in the shape of an annular plate which is structured in several layers.

FIG. 11 in illustrations 55 and 56 shows an actuator according to the invention in the shape of an annular plate, where the actuator is structured in several layers 11, 11', 11". While illustration 55 shows the individual layers 11, 11', 11" and the corresponding actuator 1 composed thereof in a perspective view looking towards the upper face/s 3 of the actuator 1 or the layers 11, 11', 11", respectively, illustration 56 shows the individual layers 11, 11', 11" and the corresponding actuator 1 composed thereof in a perspective view looking towards the lower face/s 4 of the actuator or the layers 11, 11', 11", respectively. In total, the actuator comprises seven layers, of which the uppermost and the lowermost layer each are inactive layers 11', 11". The five layers 11 disposed in-between the inactive layers 11', 11" each on their upper face 3 have two essentially semicircular electrodes 6, 7 separated from each other by the separating area portions 13, 14. On the lower face 4 of the layers 11 disposed in-between the inactive layers 11', 11" are also two essentially semi-circular electrodes 8, 9 separated from each other by the separating area portions 15, 16, which are arranged at an offset of about 90° from the electrodes 6, 7 of the upper face 3. The respective opposite electrodes of adjacent layers 11 each have the same orientation.

The upper inactive layer 11' on its upper face 3 has four termination electrodes 19, each having essentially the shape of a quarter circle and of which two adjacent electrodes each are separated or insulated by insulating sections 20 from each other. The lower inactive layer 11", however, has no electrodes. The electrodes—not shown in illustrations 55 and 56 of FIG. 11—provided on the side faces of the layers arranged between the inactive layers can be supplied with a corresponding actuation voltage via the termination electrodes Electrical contacting from only one side of the actuator is thus possible and presently in particular from the upper face, which is advantageous in particular for automated fabrication. It is of course also possible to provide only the lower inactive layer 11" with termination electrodes 19. Providing termination electrodes on the upper inactive layer 11' and on the lower inactive layer 11" is also conceivable.

Figure 12:
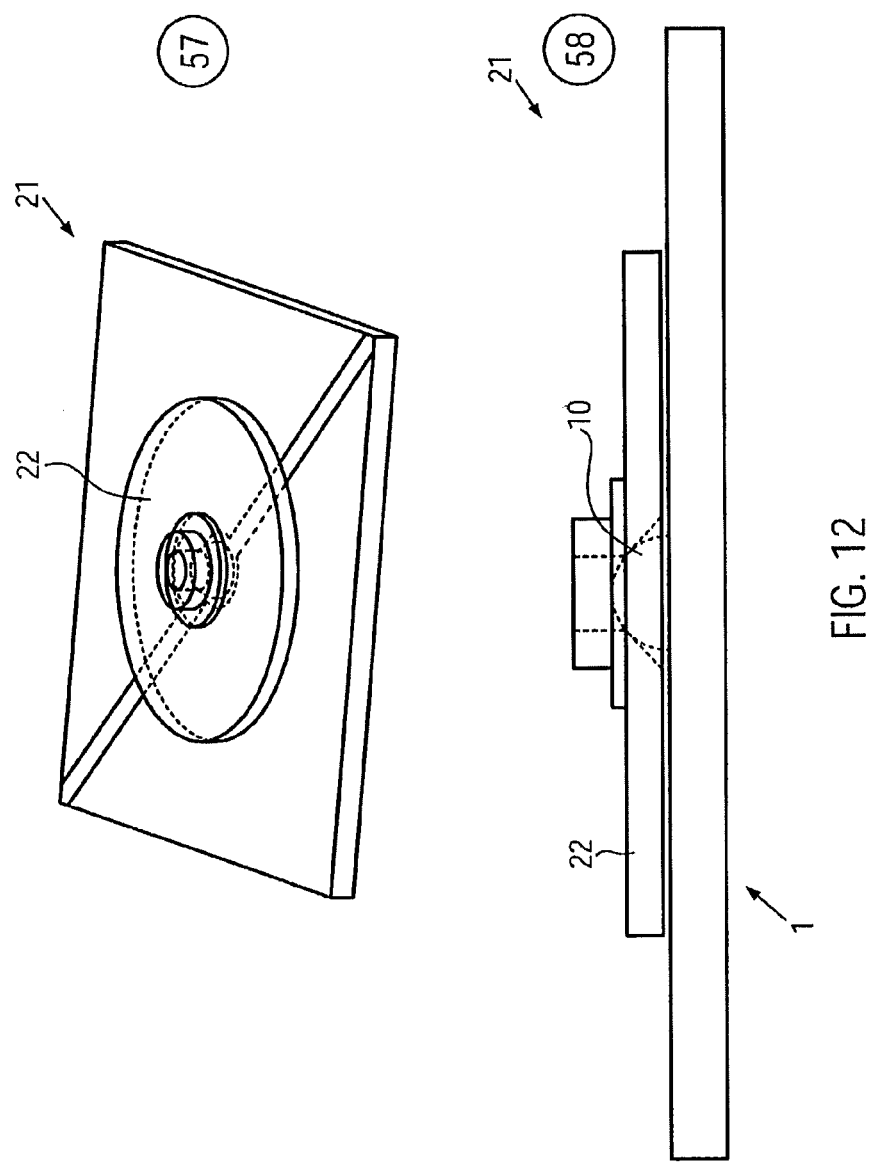
FIG. 12 shows a motor with the actuator according to the invention according to FIG. 1

FIG. 12 in illustrations 57 and 58 shows a motor 21 with the actuator according to the invention according to FIG. 1 This is a rotary motor, where the actuator 1 according to the illustration in FIG. 5 is electrically actuated such that its friction element 10 disposed at the center performs a circular motion. This circular motion is transmitted to the rotor 22, with which the friction element 10 is in frictional contact. In this case, the actuator 1 acts as a stator, and the element to be moved by means of the friction element 10 is a rotor 22.

The invention claimed is:

1. Actuator in the form of a single-layer or multi-layer flat plate, comprising:
   an upper face;
   a lower face;
   at least one layer having two electrodes spaced from each other by a linear separating area and arranged opposite each other both on its upper face and on its lower face, said electrodes of said upper face are arranged at an offset from said electrodes of said lower face;
   wherein said actuator comprises at least one friction element, said friction element being arranged along said separating area;
   wherein the electrodes of said upper face are configured to oscillate deformations of said actuator along a first axial direction for driving a movable element in contact with said actuator in said first axial direction and said electrodes of said lower face are configured to oscillate deformations of said actuator along a second axial direction for driving the movable element in contact with said actuator in said second axial direction, when the electrodes of said upper face and the electrodes of said lower face are electrically actuated respectively.

2. Actuator according to claim 1, wherein said actuator has the shape of a polygonal plate.

3. Actuator according to claim 2, wherein said actuator has the shape of a square plate.

4. Actuator according to claim 1, wherein said electrodes of said upper face are arranged at an offset from said electrodes of said lower face by essentially 90°.

5. Actuator according to claim 1, wherein said friction element is inserted into said actuator.

6. Actuator according to claim 5, wherein said friction element is inserted into a through hole provided in said actuator.

7. Actuator according to claim 1, wherein said actuator has a multilayer structure and an odd number of layers, where said respective electrodes facing each other on adjacent layers have the same orientation.

8. Actuator according to claim 7, wherein the uppermost layer and lowermost layer of said actuator are inactive layers.

9. Actuator according to claim 8, wherein said uppermost layer and/or said lowermost inactive layer are/is provided with termination electrodes.

10. Actuator according to claim 1, wherein said actuator is operated while exciting the second resonant frequency or an integral multiple of the second longitudinal resonance frequency.

11. Actuator according to claim 1, wherein, said electrodes of said upper face and said electrodes of said lower face are configured to oscillate hula-hoop-like deformations for rotationally driving a movable element in contact with said actuator by dephased electrically actuating said electrodes of said upper face and said electrodes of said lower face.

12. Actuator according to claim 1, wherein said deformations obtained by electrical actuation of said electrodes are located in the plane of said actuator.

13. Motor, comprising said actuator according to claim 1 and the moveable element to be driven by said actuator.

14. Actuator according to claim 1, wherein said actuator includes a piezoelectric material.

15. Actuator according to claim 1, wherein said at least one friction element is arranged at the center or at one end of said linear separating area.

* * * * *